United States Patent
Jean et al.

[11] Patent Number: 6,008,535
[45] Date of Patent: Dec. 28, 1999

[54] METHOD OF MAKING A SEMICONDUCTOR DIODE FROM LAMINATED CERAMIC TAPE

[75] Inventors: Jau-Ho Jean, Taipei; Chia-Ruey Chang, Tainan; Shin-Chun Lin, Taipei, all of Taiwan

[73] Assignee: Advanced Ceramic X Corp., Taipei, Taiwan

[21] Appl. No.: 09/154,578

[22] Filed: Sep. 17, 1998

[51] Int. Cl.[6] .................................................. H02L 21/60
[52] U.S. Cl. ........................ 257/701; 257/688; 257/703; 257/787; 438/106; 438/127
[58] Field of Search .................... 257/701, 703, 257/702, 668, 676, 787; 438/126, 124, 106

[56] References Cited

U.S. PATENT DOCUMENTS

| | | | |
|---|---|---|---|
| 4,540,603 | 9/1985 | Hidaka et al. | 427/82 |
| 4,972,139 | 11/1990 | Beazley | 324/78 R |
| 5,019,535 | 5/1991 | Wojnarowski et al. | 437/209 |
| 5,166,098 | 11/1992 | Micic et al. | 437/219 |
| 5,324,986 | 6/1994 | Ueno et al. | 257/701 |
| 5,337,216 | 8/1994 | McIver | 361/728 |
| 5,491,111 | 2/1996 | Tai | 438/126 |
| 5,550,086 | 8/1996 | Tai | 437/209 |
| 5,712,197 | 1/1998 | Sanders et al. | 438/127 |

FOREIGN PATENT DOCUMENTS

| | | | |
|---|---|---|---|
| 40 4168755 | 6/1992 | Japan | 257/703 |
| 40 5110157 | 4/1993 | Japan | 257/703 |
| 40 4044251 | 2/1999 | Japan | 257/701 |

*Primary Examiner*—Donald L. Monin, Jr.
*Assistant Examiner*—Michael Dietrich
*Attorney, Agent, or Firm*—Michael D. Bednarek; Crowell & Moring LLP

[57] ABSTRACT

The present invention provides a new packaging form of a semiconductor diode, which is fabricated by using low-temperature cofired ceramic (LTCC) technology. The fabrication method is low-cost and the resulting chip form semiconductor diode has good hermeticity and high reliability. The fabrication method includes the steps of: (a) providing a ceramic green tape having a through hole for positioning a diode die; (b) positioning a diode die in the through hole; (c) sandwiching the diode die between two ceramic green tapes having printed conductive layers facing the electrode surfaces of the diode die; (d) laminating the ceramic tapes into a compact such that the conductive layers connect to the electrodes of the diode die; (e) firing the laminated parts to form a monolithic sintered body; and (f) forming end terminals, and solder-plating the end terminals to finish a ceramic chip of the semiconductor diode.

7 Claims, 2 Drawing Sheets

METHOD OF MAKING A SEMICONDUCTOR DIODE FROM LAMINATED CERAMIC TAPE

BACKGROUND OF THE INVENTION

1. Field of the Invention

The present invention relates to package fabrication technology. More particularly, the present invention provides a new packaging form of a semiconductor diode, which is fabricated by using low-temperature cofired ceramic (LTCC) technology. The resultant chip form semiconductor diode has improved hermeticity and reliability, and the fabrication method is also simple and low-cost.

2. Description of the Related Arts

Regular semiconductor diode packaging methods can be classified into three types; namely, the metal or ceramic container package, the plastic molding package, and the spin-coating glass package. According to the metal or ceramic container package, a diode die is placed into the cavity of a metal or ceramic container; then, the two opposite electrode surfaces of the diode die are connected to conductive elements by soft soldering or hard brazing. This method does not achieve a compact assembly, and the resulting package is poor in hermeticity and reliability. According to the plastic molding package, the diode die is connected to the conductive elements first, and then encapsulated with plastics. A compact packaging assembly can be obtained by the plastic molding package; however, because the inner conductor cannot be processed at high temperatures, ceramics cannot be used to replace the sealing plastics to guarantee a better hermeticity. Thus, the hermeticity problem is still a concern. As to the spin-coating glass package, refractory metals such as molybdenum or tungsten are used for connection with the diode die. The diode die is connected to the electrode element made of molybdenum or tungsten to form a sub-assembly, and the sub-assembly is spin-coated by a slurry of glass powder and then fired at a high temperature to form a good hermitic packaging. However, the use of molybdenum or tungsten increases the processing complexity, and the resulting diode component, moreover, is of bead form, limiting its usage.

The trend for increasing the volume efficiency, and reliability of electrical components requires the development of the chip form semiconductor diode. The core technology for fabricating chip form diodes includes:

(1) the thin-film method—coating, photo-lithography, and etching; and (2) the thick-film method—tape casting, screen-printing, and laminating.

The thin-film process is largely used for the fabrication of diode dies, while the thick-film process is largely for packaging. The present invention relates to a packaging process using low-temperature cofired technology. This technology can effectively reduce the processing complexity and at the same time increase the hermeticity and reliability.

A process for manufacturing resin-molded semiconductor devices is described in U.S. Pat. No. 4,540,603. In the process, a semiconductor pellet is brazed to a pair of axial leads to form a sub-assembly, and then an epoxy resin is deposited on the sub-assembly and hardened. This packaging using plastic molding cannot resist high temperatures and its hermeticity is not sufficient. A similar process for fabricating semiconductor devices is described in U.S. Pat. No. 4,972,139, in which aluminum metalization layers are applied to the top and bottom of a semiconductor die and are used for a high temperature brazing of contact members to the die.

U.S. Pat. No. 5,166,098 discloses a method of manufacturing an encapsulated semiconductor device with a can type housing. In this method, a semiconductor die is inserted into a prefabricated plastic can, followed by filling the can with curable plastic compounds.

U.S. Pat. No. 5,019,535 discloses a die attachment method using nonconductive adhesive for use in high density interconnected assemblies. The method affixes integrated circuit chips to a substrate by using a thermoplastic polyimide adhesive instead of conductive materials. The method is very effective for reducing package sizes, but it restricts the flexibility of the circuit design.

U.S. Pat. No. 5,337,216 discloses a small outline integrated circuit package, in which epoxy resins are used for postmolding. This package has a low profile that allows it to be used in thin profile, high density electronic assemblies. However, the hermeticity and reliability are still not comparable to that of ceramic packaging.

U.S. Pat. No. 5,550,086 describes a fabrication method of ceramic chip form semiconductor diode. According to the method, a diode die is attached to a plate-like ceramic body element having external electrodes, and encapsulated by applying glass paste thereto. After the external electrodes and the electrodes of the diode die are connected by a conductive layer, they are covered by an over glaze to finish the package.

SUMMARY OF THE INVENTION

It is an object of the invention to provide a fabrication method for a ceramic chip form semiconductor diode which can effectively reduce the processing complexity and the manufacturing cost.

Another object of the invention is to provide a new packaging form of a semiconductor diode which has good hermeticity and high reliability.

To accomplish the above objectives, the present invention provides a fabrication method for ceramic chip form semiconductor diodes by using low-temperature cofired ceramic (LTCC) technology. The present invention for fabricating a ceramic chip form semiconductor diode comprises the steps of:

(a) providing a ceramic green tape having a through hole for positioning a diode die;

(b) positioning a diode die in the through hole;

(c) sandwiching the diode die between two ceramic green tapes having printed conductive layers facing the electrode surfaces of the diode die;

(d) laminating the ceramic tapes into a compact such that the conductive layers connect to the electrodes of the diode die;

(e) firing the laminated parts to form a monolithic sintered body; and (f) forming end terminals, and solder-plating the end terminals to finish a ceramic chip of the semiconductor diode.

Other objects, features, and advantages of the present invention will become apparent from the following detailed description which makes reference to the accompanying drawings.

DETAILED DESCRIPTION OF THE INVENTION

Figure 1:
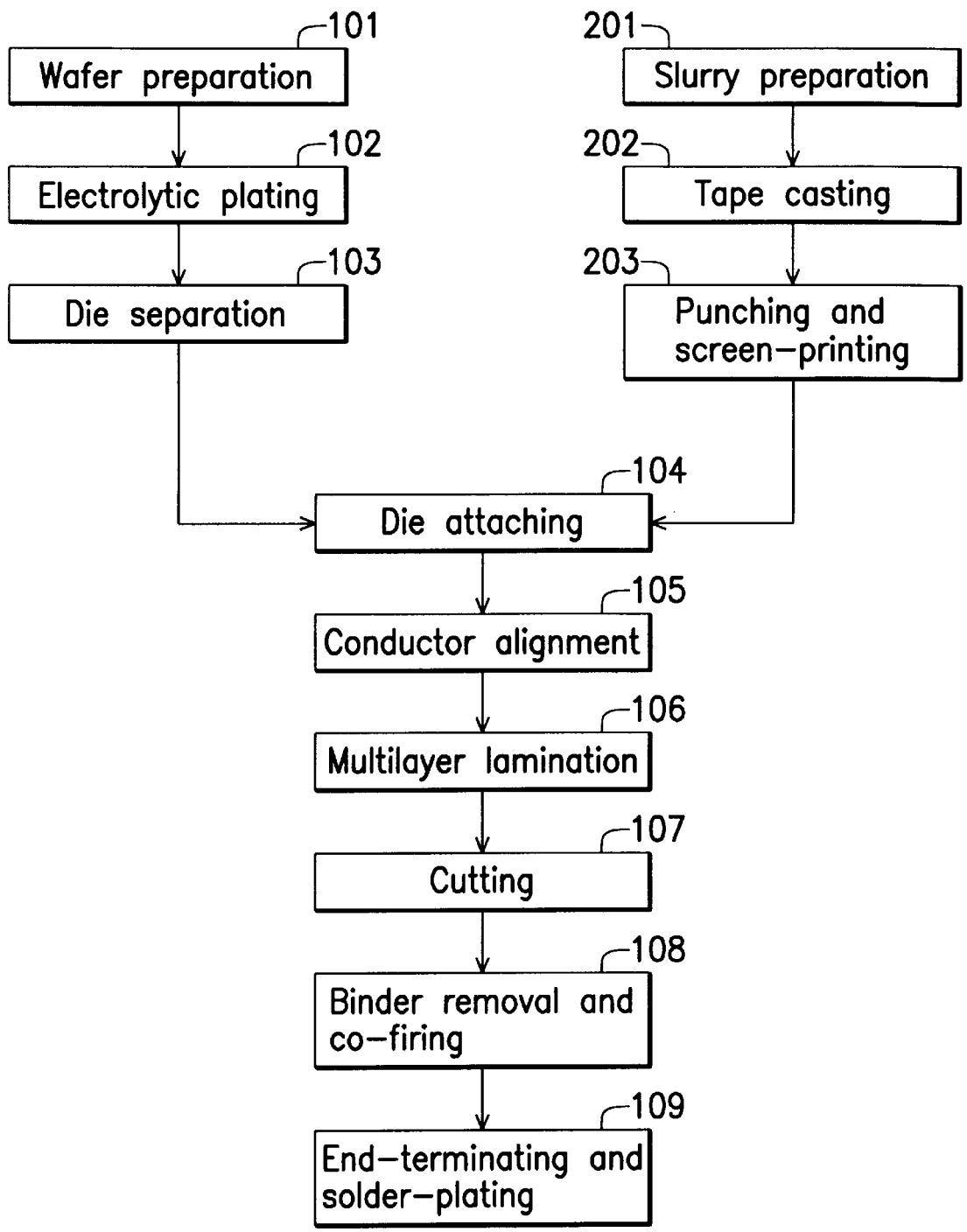
FIG. 1 is a flow chart illustrating the packaging process according to the invention.

The invention is described in more detail by referring to the flow chart of FIG. 1.

Diodes are prepared by diffusing p-n junctions into a semiconductor wafer (101). Plated layers, such as aluminum, nickel, silver, or gold are applied on the wafer surface by electrolytic plating (102). The diodes on the wafer are separated into individual dies by scribing or sawing (103), followed by chemical polishing and oxidizing.

The separated diode die will be incorporated into a protective package as follows. A slurry of ceramic powder and liquid vehicle (solvent and plasticized resin binder) is first prepared (201). The ceramic powder used herein must be co-firable with diode dies at low temperatures. In other words, the sintering temperature of the ceramic powder should not exceed 800° C. The slurry is then cast into thin green tapes by passing a casting blade (202). After they dry, the green tapes are cut to size, and through holes are mechanically punched into the tape. Then custom wiring paths are screen-printed onto the surface of the green tape by conventional thick-film printing (203).

The diode die is placed into the through hole of the green tape (104); note that the thickness of the green tape should be slightly greater than that of the diode die. Then the diode die is sandwiched between two ceramic green tapes with the printed conductive layers facing the opposite electrode surfaces of the diode die. The diode die and the conductive layers are assembled in precise alignment (105) and laminated to form a multilayer ceramic green compact by either hydrostatic pressing or single-axial pressing (106). After cutting (107), the laminates are fired at 500° C. for one hour to remove the binder completely and then heated to a higher temperature, but not exceeding 800° C., to form a densified ceramic body (108). Finally, to complete the package, the monolithic sintered body is subjected to end-terminating and solder-plating processes to form a ceramic chip of the semiconductor diode (109).

Figure 2A:
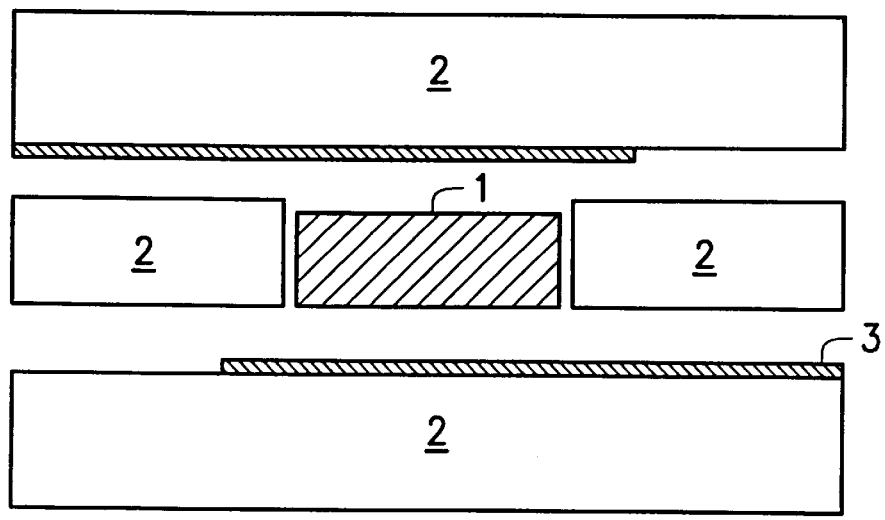
FIG. 2A is a cross-sectional side view showing the elements of this ceramic package before they are laminated together.
Figure 2B:
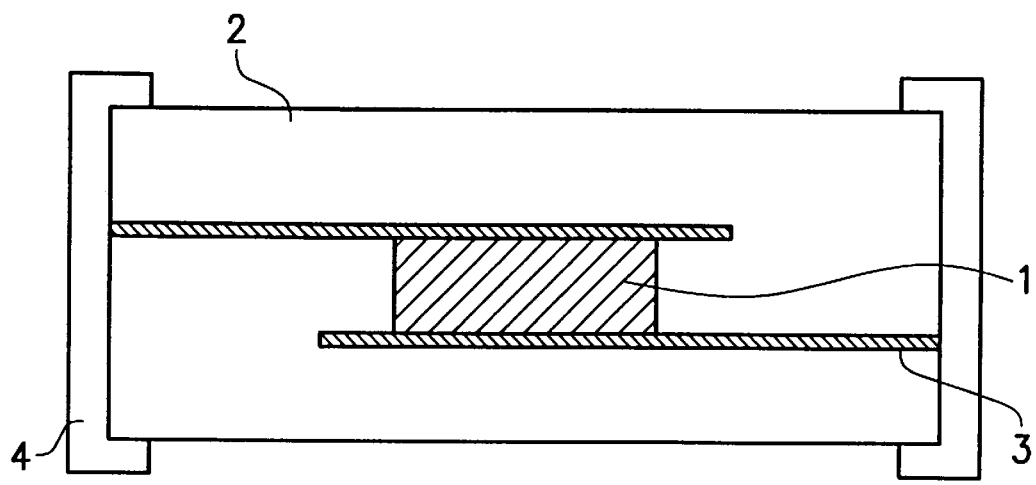
FIG. 2B is a cross-sectional side view showing the resultant ceramic chip form semiconductor diode according to the invention.

FIG. 2A is a cross-sectional side view showing the elements of this ceramic package before they are laminated together. FIG. 2B is a cross-sectional side view showing the resultant ceramic chip form semiconductor diode according to the invention. As illustrated, this ceramic chip semiconductor diode includes a diode die 1, a ceramic body element 2, conductor elements 3 mounted on two opposite electrode surfaces of the diode die 1, and end terminals 4.

This new packaging form of a semiconductor diode is fabricated by using low-temperature cofired ceramic technology. The co-firing temperature of the packaging materials and the diode die must not exceed 800° C., or the diode die will be ruined. In addition, because the package hermeticity will be greatly affected by the X-Y shrinkage of the green tapes, the through hole size and the laminating conditions become critical in this fabrication. Further, when the ceramic package is surface-mounted on a circuit board, a thermal coefficient of expansion (TCE) mismatch sometimes causes a large thermal stress on the solder joints that could lead to joint breakage during soldering. Therefore, it is also important that the package should have a TCE close to that of diode die.

While the invention has been particularly shown and described with the reference to the preferred embodiment thereof, it will be understood by those skilled in the art that various changes in form and details may be made without departing from the spirit and scope of the invention.

What is claimed is:

1. A fabrication method for ceramic chip form semiconductor diode, comprising the steps of:

(a) providing a ceramic green tape having a through hole for positioning a diode die;

(b) positioning a diode die in the through hole;

(c) sandwiching the diode die between two ceramic green tapes having printed conductive layers facing the electrode surfaces of the diode die;

(d) laminating the ceramic tapes into a compact such that the conductive layers connect to the electrodes of the diode die;

(e) firing the laminated parts to form a monolithic sintered body; and (f) forming end terminals, and solder-plating the end terminals to finish a ceramic chip of the semiconductor diode.

2. The fabrication method as claimed in claim 1, wherein in step (a) the thickness of the green tape is slightly greater than that of the diode die.

3. The fabrication method as claimed in claim 1, wherein the printed conductive layers of the green tapes are made by thick film printing.

4. The fabrication method as claimed in claim 1, wherein the layered ceramic tapes are laminated by hydrostatic pressing or single-axial pressing.

5. The fabrication method as claimed in claim 1, wherein step (d) further comprises cutting the laminated tapes.

6. The fabrication method as claimed in claim 1, wherein said firing is carried out at a temperature not exceeding 800° C.

7. A ceramic chip form semiconductor diode which is produced according to the fabrication method described in claim 1.

* * * * *